(12) United States Patent
Tomastik

(10) Patent No.: US 12,260,980 B2
(45) Date of Patent: Mar. 25, 2025

(54) NEUTRAL AND/OR GROUND HARMONIC FILTER SYSTEM

(71) Applicant: ENERGY EIGHT, LLC, Alpharetta, GA (US)

(72) Inventor: Josef Tomastik, Norcross, GA (US)

(73) Assignee: ENERGY EIGHT, LLC, Alpharetta, GA (US)

( * ) Notice: Subject to any disclaimer, the term of this patent is extended or adjusted under 35 U.S.C. 154(b) by 0 days.

(21) Appl. No.: 18/659,357

(22) Filed: May 9, 2024

(65) Prior Publication Data

US 2024/0379282 A1    Nov. 14, 2024

Related U.S. Application Data

(60) Provisional application No. 63/500,960, filed on May 9, 2023.

(51) Int. Cl.
| | | |
|---|---|---|
| *H01F 27/28* | (2006.01) | |
| *H01F 27/02* | (2006.01) | |
| *H03H 1/00* | (2006.01) | |
| *H03H 7/01* | (2006.01) | |

(52) U.S. Cl.
CPC ......... *H01F 27/2823* (2013.01); *H01F 27/02* (2013.01); *H03H 7/01* (2013.01); *H03H 1/00* (2013.01)

(58) Field of Classification Search
CPC ...... H03H 1/0007; H03H 7/09; H03H 7/0115; H03H 27/02; H01F 2027/2089; H01F 27/2823
USPC .................. 333/181, 185; 336/180–184, 220
See application file for complete search history.

(56) References Cited

U.S. PATENT DOCUMENTS

| | | |
|---|---|---|
| 7,948,342 B2 | 5/2011 | Long |
| 11,424,069 B2 | 8/2022 | Sella et al. |
| 2001/0028281 A1 | 10/2001 | Miura et al. |
| 2006/0255899 A1 | 11/2006 | Lee et al. |
| 2010/0156194 A1 | 6/2010 | Navid et al. |
| 2011/0116212 A1 | 5/2011 | Rosemore et al. |
| 2012/0105190 A1 | 5/2012 | Mitani et al. |
| 2013/0063237 A1 | 3/2013 | Morimoto et al. |

OTHER PUBLICATIONS

International Search Report and Written Opinion for International Application No. PCT/US2024/028506, Aug. 22, 2024, (13 pages), U.S. Patent and Trademark Office, US.

*Primary Examiner* — Rakesh B Patel
(74) *Attorney, Agent, or Firm* — Alston & Bird LLP

(57) ABSTRACT

Various embodiments of the present disclosure provide a neutral and/or ground harmonic filter system for mitigating neutral and/or ground harmonics.

20 Claims, 6 Drawing Sheets

NEUTRAL AND/OR GROUND HARMONIC FILTER SYSTEM

CROSS REFERENCE TO RELATED APPLICATION

This patent application claims priority to U.S. Application No. 63/500,960 filed May 9, 2023, the contents of which are hereby incorporated in their entirety by reference.

TECHNICAL FIELD

The disclosure relates to the technical field of electrical systems. In particular, the disclosure relates to an electrical filter related to an electrical power system.

BACKGROUND

According to the US Energy Information Administration in 2022, commercial and industrial sectors in the USA account for 35.4% and 26.0% respectively of electrical energy consumed, and 6.9% and 22.9% respectively of total electrical generation-based greenhouse gas emissions (GHG). This accounts for 1,889 million metric tons of carbon dioxide ($CO_2$) and 2.41 billion Megawatt-hours (MWh) of 4.07 billion MWh generated in the USA. In 1995, the Washington State Energy Office suggested that 2% of energy consumption in commercial and industrial facilities was due to general power quality issues including power factor, loose connections, over and under voltage, and voltage unbalance and that at least an additional 2% due to harmonic distortion from non-linear loads. In 2017, EASI published 'Distribution Losses in Industrial Facilities,' which referenced total distribution losses dominated by harmonic content that can increase energy consumption an average of 25% in industrial facilities. The values of potential losses vary by type of industry beyond commercial and industrial facilities, and these can be considered average across all electrical energy consumption and generation facilities. Enough energy is expected to flow through neutral such that the NEC (National Electrical Code) generally calls for neutrals being at least 200% oversized from power conductors.

Electrical systems, outside of power generation and residential, are typically configured as 3 or 4 wire systems comprised of ungrounded, bonded, high or low resistance grounding and may also include a neutral conductor in 4-wire power and single-phase lighting and outlet loads. Due to non-linear electronic and power system loads such as LED lighting and variable frequency drives, the power system becomes distorted with multiple frequencies that are integer multiples of the fundamental frequency, such as 60 Hz in the USA. These harmonic frequencies occur as multiples of third harmonic for single phase systems, also called triplen harmonics, and multiples of +/−1 of the number of converter or inverter power electronics, or switches (e.g., minimum of 6 for 3-phase systems), resulting in 5th and 7th harmonic and multiples. In 4-wire, 3-phase systems these will also appear in both the neutral and/or ground conductors and in ground conductors for all other systems that do not contain a neutral. Harmonic voltage and current directly result in watts losses and show in the form of heat which impacts system demand and consumption. The watt losses are a direct result in the potential difference between the neutral tie point (transformer) and equipment versus reference ground with the loads including $I^2R$, capacitive loads, transformer resonance, and earthing.

Virtually all harmonic correction devices are currently selected for the power supply and system with the intent of meeting power quality standards and equipment reliability. Few attempts have been made at correcting neutral and/or ground harmonics for reliability and only a few for energy consumption related to neutral and/or ground harmonics. However, it is estimated that neutral and/or ground harmonics account for at least 5% of total non-residential and power distribution electrical energy consumption.

The application of neutral and/or ground harmonic filtering can result in improved equipment reliability, improved equipment operation, improved wireless communication by eliminating RF noise, and reduced energy consumption by eliminating ground/neutral harmonic losses, amongst other benefits. Through applied effort, ingenuity, and innovation, deficiencies and problems related to the electrical system ground and neutral have been resolved by developing solutions that are configured in accordance with the embodiments of the present disclosure.

BRIEF SUMMARY

In general, embodiments of the present disclosure provide devices, filters, apparatuses, systems, methods, and/or the like for mitigating neutral and/or ground harmonics via a neutral and/or ground harmonic filter system. The details of some embodiments of the subject matter described in this specification are set forth in the accompanying drawings and the description below. Other features, aspects, and advantages of the subject matter will become apparent from the description, the drawings, and the claims.

In various embodiments, a neutral and/or ground harmonic filter system may comprise a first coil unit and a second coil unit. The first coil unit may comprise a first conductive wire coil, an insulating material, and a first non-conductive mechanical structure. The first conductive wire coil is suspended in the insulating material disposed in the first non-conductive mechanical structure. The second coil unit may comprise a second conductive wire coil, a ferrous material, and a second non-conductive mechanical structure. The second coil unit is suspended in the ferrous material disposed in the second non-conductive mechanical structure. While the term "ferreous material" is used, the ferrous material may comprise both ferrous and non-ferrous particles, such as metal particles and graphite particles. In some embodiments, the ferrous material may comprise a greater amount of the metal particles as compared to the graphite particles. In one embodiment, the ferrous material may comprise approximately ⅔ metal particles and approximately ⅓ graphite particles. As will be recognized, the portions of the different particles may vary to adapt to various needs and circumstances, such as the environment and/or application. In some embodiments, a first end of the first conductive wire coil is electrically coupled to a first contact that extends from the first non-conductive mechanical structure, and an opposite second end of the first conductive wire coil is electrically coupled to a first end of the second conductive wire coil. An opposite second end of the second conductive wire coil is electrically coupled to a second contact that extends from the second non-conductive mechanical structure. In some embodiments, the first conductive wire coil and the second conductive wire coil may comprise a same number of turns of conductive wire, for example, 12 turns. In some other embodiments, the first conductive wire coil and the second conductive wire coil may comprise different number of turns of conductive wire.

In some embodiments, the first and second conductive wire coils may comprise copper wires.

In accordance with some embodiments of the present disclosure, the first and second non-conductive mechanical structures comprise a first non-conductive tube and a second non-conductive tube, respectively. In some embodiments, a distance between a center of the first non-conductive tube and a center of the second non-conductive tube may be within a range between 1 inch and 3 inches, such as less than 2.25 inches.

In accordance with some embodiments of the present disclosure, the neutral and/or ground harmonic filter system may further comprise a housing unit in which the first coil unit and the second coil unit are both disposed. In some embodiments, the housing unit may comprise a ground loop. In some embodiments, the neutral and/or ground harmonic filter system may further comprise a housing insulating material disposed in the housing unit. In some embodiments, the housing insulating material may comprise epoxy and acetone. In some embodiments, the first and second contacts can further extend from the housing unit, providing electrical contacts to other electrical systems.

In accordance with some embodiments of the present disclosure, the first contact and the second contact of the neutral and/or ground harmonic filter system are electrically coupled to a first location and a second location of a conductor bar (e.g., a neutral bar or a ground bar) of an electrical system, respectively, to mitigate neutral and/or ground harmonics. The first location and the second location are spaced apart so that a first set of conducting wires of the electrical system are electrically coupled to the conductor bar at locations between the first location and the second location. When the first contact and the second contact of the neutral and/or ground harmonic filter system are electrically coupled to the neutral bar, the first set of conducting wires comprises all neutral wires of the electrical system that are electrically coupled to the neutral bar. When the first contact and the second contact of the neutral and/or ground harmonic filter system are electrically coupled to the ground bar, the first set of conducting wires comprises all ground wires of the electrical system that are electrically coupled to the ground bar.

BRIEF DESCRIPTION OF THE DRAWINGS

Reference will now be made to the accompanying drawings, which are not necessarily drawn to scale, and wherein.

DETAILED DESCRIPTION

Figure 1:
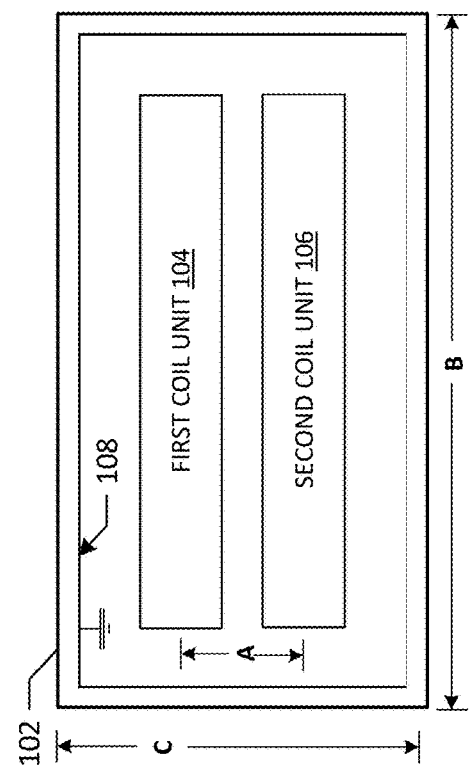
FIG. 1 provides an example neutral and/or ground harmonic filter system, according to one or more embodiments of the present disclosure.

Various embodiments of the present disclosure are described more fully hereinafter with reference to the accompanying drawings, in which some, but not all embodiments of the present disclosure are shown. Indeed, the present disclosure may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "example" are used to be examples with no indication of quality level. Terms such as "computing," "determining," "generating," and/or similar words are used herein interchangeably to refer to the creation, modification, or identification of data. Further, "based on," "based at least in part on," "based at least on," "based upon," and/or similar words are used herein interchangeably in an open-ended manner such that they do not necessarily indicate being based only on or based solely on the referenced element or elements unless so indicated. Like numbers refer to like elements throughout.

As discussed above, while much effort has been expended on resolving power harmonic conditions, little to no effort has been applied to neutral and/or ground harmonics. Various embodiments of the present disclosure are directed to apparatus, systems, and methods for neutral and/or ground harmonic filtering.

In some embodiments, a neutral and/or ground harmonic filter system 100 comprises a shunt inductive filter for current. The terms system, filter, device, and/or similar words may be used herein interchangeably to refer to the neutral and/or ground harmonic filter system 100 as a whole or certain components individually. The neutral and/or ground harmonic filter system 100 is designed to alter the circuit impedance to smooth the ground and neutral current waveform with the interaction of magnetic fields between two or more coils. In one embodiment, there are two coils. In another embodiment, there are three coils. In yet another embodiment, there are four coils. The number of coils may vary to adapt to various needs and circumstances, such as the environment and application.

The coils may comprise insulated or uninsulated conductors wrapped around a conductive or nonconductive tube or in air. These coils may be placed in containers or within an enclosure, housing unit, and/or similar words used herein interchangeably with or without a ferrous or ferrous/graphite mixture. The coils are placed in a configuration that is selected to tune neutral and/or ground harmonic filter system 100 to specific ranges of harmonic current frequencies. The coils are wound either in the same direction or opposite direction in order to filter specific frequencies. A first insulated conductor is connected to one end of the first coil, and the opposite end of the first coil is connected to one end of the second coil (and so on) with the final (or the last) insulated conductor from the last coil. The first and last insulated conductors are brought out from a housing unit 102 of the neutral and/or ground harmonic filter system 100. An insulated ground conductor is connected to housing unit, if it is metal, for safety and to use metal enclosures or housing units as a Faraday shield to reduce EMI/RFI (electro-magnetic induction/radio frequency interference). In instances where non-metallic materials are used for the housing unit 102, the housing unit 102 can comprise a Faraday cage surrounding the internal coils and materials and being connected via an insulated ground conductor that extends from the housing unit 102.

The orientation of neutral and/or ground harmonic filter system 100 has no effect on operation. In the case of neutral harmonic filtering, one of the first and last insulated conductors of neutral and/or ground harmonic filter system 100 is connected to one end of the associated neutral conductor or neutral bar and the other is connected to the other end of the associated neutral conductor or neutral bar bracketing any load neutral conductors. The ground conductor is connected to ground.

In the case of ground harmonic filtering, one of the first and last insulated conductors of neutral and/or ground harmonic filter system 100 is connected to one end of the associated ground conductor or ground bar and the other is connected to the other end of the ground conductor or ground bar at a location of the associated ground conductor that would provide a resistive voltage drop. The ground conductor is connected to a separate ground location, such as the electrical enclosure neutral and/or ground harmonic filter system 100 is filtering.

Neutral and/or ground harmonic filter system 100 may be used to mitigate neutral and/or ground harmonics in many applications including but not limited to the neutral and/or grounds of solar energy systems and controls, wind power systems, geothermal systems, uninterruptible power supplies, variable frequency drives, soft starts, vehicle or equipment charging systems, machinery systems, other power generation systems, controls and PLCs, and/or other devices, components, systems, and/or the like that either generate neutral and/or ground harmonics and electrical or mechanical systems containing a ground or neutral pathway.

A. EXAMPLE NEUTRAL AND/OR GROUND HARMONIC FILTER SYSTEM

According to various embodiments, a neutral and/or ground harmonic filter system 100 is provided. An example neutral and/or ground harmonic filter system 100 is shown in FIG. 1, according to one or more embodiments of the present disclosure. The neutral and/or ground harmonic filter system 100 comprises a housing unit 102. In some embodiments, the housing unit 102 can be made of a conductive material, such as aluminum, aluminum alloy, metal plate, or another type of conductive material. The housing unit 102 can provide a Faraday cage for eliminating RFI/EMI. In some other embodiments, the housing unit 102 can be made of a non-conductive material such as plastic, fiberglass, or another type of non-conductive material. In a non-limiting example, the non-conductive material of the housing unit 102 is a thermoplastic polymer made from petroleum (HDPE). In certain embodiments where the housing unit 102 is made of non-conductive material, the housing unit 102 can further comprise a Faraday cage surrounding conductive wire coils and other components disposed inside the housing unit 102 to mitigate EMI/RFI.

In some embodiments, the neutral and/or ground harmonic filter system 100 further comprises at least a first coil unit 104 and a second coil unit 106 disposed inside the housing unit 102. In one or more embodiments, the housing unit 102 further comprises a ground loop 108, serving as a ground connection to the housing unit. In one or more embodiments, the ground loop 108 can be a ground wire that is made of copper or another type of conductive material.

In one or more embodiments, the first coil unit 104 is separated from the second coil unit 106 by a distance A. For example, in one or more embodiments, the distance A between the first coil unit 104 and the second coil unit 106 (e.g., between a center of the first coil unit 104 and a center of the second coil unit 106) is less than 2.25 inches. In some embodiments, the distance A between the first coil unit 104 and the second coil unit 106 can be within a range, such as between 0.75 inches and 2.5 inches. In one embodiment, the distance A can be equal to or approximately 1.25 inches. However, it is to be appreciated that the distance A between the first coil unit 104 and the second coil unit 106 can be another value that is less than 2.5 inches and greater than 0.0 inches. As will be recognized, specified ranges may be modified to adapt to various needs and circumstances, such as the environment and/or application.

The housing unit 102 includes a length B and a width C. In some embodiments, the length B can be within a range, such as between 2 inches and 6 inches. In one embodiment, the length B of the housing unit 102 is equal to or approximately 4.52 inches. Additionally, in one or more embodiments, the width C of the housing unit 102 can be within a range, 2 inches to 6 inches. In one embodiment, the width C of the housing unit 102 is less than the length and equal to or approximately 2.76 inches. In one or more embodiments, the housing unit 102 also includes a depth that may be within a range, such as between 1 inch and 6 inches. In one embodiment, the housing unit 102 depth is equal to or approximately 2.24 inches. Similarly, the housing unit 102 has volume. In one embodiment, the volume is equal to or approximately 20.75 cubic inches. As will be recognized, specified ranges may be modified to adapt to various needs and circumstances, such as the environment and/or application.

In one or more embodiments, the ground loop 108 has a length and a width. In some embodiments, the length may be between 1 inch and 6 inches, and the width may be between 1 inch and 6 inches. In one embodiment, the ground loop 108 is equal to or approximately 2.90 inches in length and 2.6 inches in width. Additionally, the ground loop 108 can be a 10-gauge wire, a 12-gauge wire, or any other wire with a different wire gauge (e.g., a different wire diameter).

In one or more embodiments, the first coil unit 104 and the second coil unit 106 may each comprise a coil housing and a conductive wire coil disposed inside the corresponding coil housing. Each coil housing may be made of a metallic material or a non-metallic material. The conductive wire coil disposed inside each coil housing may be insulated or uninsulated. For example, the first coil unit 104 may comprise a first non-metallic housing, such as a first non-conductive mechanical structure (e.g., a first non-conductive tube), and an insulated conductive wire coil, and the second coil unit 106 may comprise a first non-metallic housing, such as a second non-conductive mechanical structure (e.g., a second non-conductive tube), and an uninsulated conductive wire coil.

In one or more embodiments, the insulated conductive wire coil of the first coil unit 104 is surrounded by an insulating material. For example, the insulated conductive wire coil of the first coil unit 104 can be suspended by the insulating material disposed in the first coil unit 104. The insulating material can be air or another type of insulating material. In one or more embodiments, the uninsulated conductive wire coil of the second coil unit 106 is surrounded by a metallic material included in the second coil unit 106. For example, the uninsulated conductive wire coil of the second coil unit 106 can be suspended by a ferrous material (or ferrous matrix) disposed in the second coil unit 106. As previously noted, the ferrous material may comprise both ferrous and non-ferrous particles. In one or more embodiments, the ferrous material comprises a greater amount of the ferrous particles as compared to the non-ferrous particles. In one embodiment, the ferrous materials may include approximately ⅔ metal particles and approximately ⅓ powdered graphite. However, it is to be appreciated that the ferrous material can include a different ratio of the ferrous particles as compared to the non-ferrous particles. The ferrous material can be ferrous filings (e.g., ferrous shavings) of micro-scale ferrous material. It is to be appreciated, however, that in certain embodiments, the first coil unit 104 is alternatively an uninsulated coil housing and the second coil unit 106 is alternatively an insulated coil housing.

In one or more embodiments, the first non-conductive mechanical structure and/or the second non-conductive mechanical structure comprises poly-vinyl chloride (PVC). For example, the first non-conductive mechanical structure and/or the second non-conductive mechanical structure can be a Schedule 40 PVC tube, an HDPE plastic, or another type of PVC tube.

In one or more embodiments, the insulated or uninsulated conductive wire of the coils can be surrounded by an insulating material. In some other embodiments, the coils may be enclosed within each other and may or may not have ferrous and graphite material present.

Figure 2:
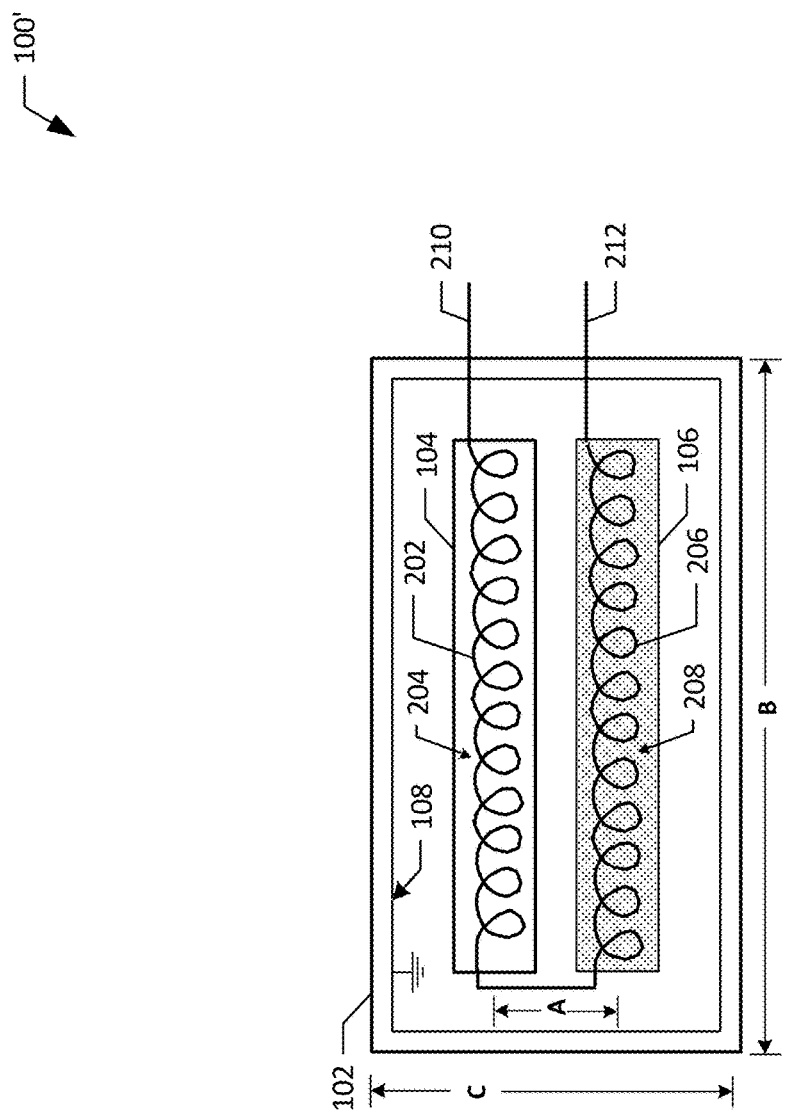
FIG. 2 provides another example neutral and/or ground harmonic filter system, according to one or more embodiments of the present disclosure.

FIG. 2 illustrates an example neutral and/or ground harmonic filter system 100', according to one or more embodiments of the present disclosure. The neutral and/or ground harmonic filter system 100' can be an alternate embodiment of the neutral and/or ground harmonic filter system 100. The neutral and/or ground harmonic filter system 100' comprises the housing unit 102, the first coil unit 104, and the second coil unit 106. The housing unit 102 comprises the ground loop 108.

In one or more embodiments, the first coil unit 104 comprises a conductive wire coil 202 and an insulating material 204. The conductive wire coil 202 and the insulating material 204 may be disposed in a non-conductive mechanical structure (e.g., a coil housing such as a non-conductive tube, etc.). In one or more embodiments, the conductive wire coil 202 is suspended in the insulating material 204 disposed in the non-conductive mechanical structure, such as the non-conductive tube, of the first coil unit 104. In one or more embodiments, the insulating material 204 is air or another type of insulating material.

In one or more embodiments, the second coil unit 106 comprises a conductive wire coil 206 and a ferrous material 208. The conductive wire coil 206 and the ferrous material 208 may be disposed in a non-conductive mechanical structure (e.g., a coil housing such as a non-conductive tube, etc.). In one or more embodiments, the conductive wire coil 206 is suspended in the ferrous material 208 disposed in the non-conductive mechanical structure, such as the non-conductive tube, of the second coil unit 106. In one or more embodiments, the ferrous material 208 comprises metal particles and graphite particles. In one or more embodiments, the ferrous material 208 comprises a greater amount of the metal particles as compared to the graphite particles. For example, the ferrous material 208 can include approximately ⅔ of the metal particles and approximately ⅓ of the graphite particles. However, as previously noted, it is to be appreciated that the ferrous material 208 can include a different ratio of the ferrous particles (e.g., metal material) as compared to the non-ferrous particles (e.g., graphite material). The ferrous material can be ferrous filings (e.g., ferrous shavings) of micro-scale ferrous material.

In one or more embodiments, the conductive wire coil 202 comprises a first coil winding in a first direction and the conductive wire coil 206 comprises a second coil winding in a second direction that is opposite to the first direction. For example, the first direction of the first coil winding for the conductive wire coil 202 can be a clockwise direction and the second direction of the second coil winding for the conductive wire coil 206 can be a counterclockwise direction. In another example, the first direction of the first coil winding for the conductive wire coil 202 can be a counterclockwise direction and the second direction of the second coil winding for the conductive wire coil 206 can be a clockwise direction. However, in one or more alternate embodiments, a coil winding of the conductive wire coil 202 and conductive wire coil 206 can be in a same corresponding direction (e.g., a clockwise direction or a counterclockwise direction).

In one or more embodiments, dimensionality of the conductive wire coil 202 is different than the conductive wire coil 206. In one or more embodiments, a length of the conductive wire coil 202 is greater than a length of the conductive wire coil 206, with both lengths being within a range such as between 1 inch and 5 inches. In one embodiment, the length of the conductive wire coil 202 is equal to or approximately 2.55 inches, and a length of the conductive wire coil 206 can be equal to or approximately 1.89 inches.

In one or more embodiments, a diameter of the conductive wire coil 202 can be greater than a diameter of the conductive wire coil 206, with each diameter being within a range, such as between 0.1 inch and 1.5 inches. In one embodiment, the diameter of the conductive wire coil 202 can be equal to or approximately 0.58 inches, and the diameter of the conductive wire coil 206 can be equal to or approximately 0.48 inches. As will be recognized, specified ranges may be modified to adapt to various needs and circumstances, such as the environment and/or application.

In one or more embodiments, the conductive wire coil 202 and the conductive wire coil 206 can include a corresponding number of coil turns within a range, such as between 8 and 1,000 coil turns (or even more). In one embodiment, the conductive wire coil 202 and the conductive wire coil 206 can both include 12 coil turns. In another embodiment, the conductive wire coil 202 and the conductive wire coil 206 can both include 24 coil turns. In yet another embodiment, the conductive wire coil 202 and the conductive wire coil 206 can both include 50 coil turns. In still another embodiment, the conductive wire coil 202 and the conductive wire coil 206 can both include 1,000 coil turns (or even more). However, in certain embodiments, the number of coil turns of the conductive wire coil 202 can be different than a number of coil turns of the conductive wire coil 206, both within the range between 8 to 1,000 coil turns (or even more). As will be recognized, specified ranges may be modified to adapt to various needs and circumstances, such as the environment and/or application.

In one or more embodiments, the conductive wire coil 202 comprises a first end coupled to a contact 210 and a second end opposing to the first end. The conductive wire coil 206 comprises a second end coupled to a contact 212 and a first end opposing to the second end. The second end of the conductive wire coil 202 is electrically coupled to the first end of the conductive wire coil 206. The contact 210 can extend from the housing unit 102. Additionally, the contact 210 can be configured to electrically and/or mechanically couple to a first location of a neutral conductor (or neutral bar) or a ground conductor (or ground bar) of an electrical power system. The contact 212 can also extend from the housing unit 102. Additionally, the contact 212 can be configured to electrically and/or mechanically couple to a second location of a neutral conductor (or neutral bar) or a ground conductor (or ground bar) of the electrical power system.

Figure 3:
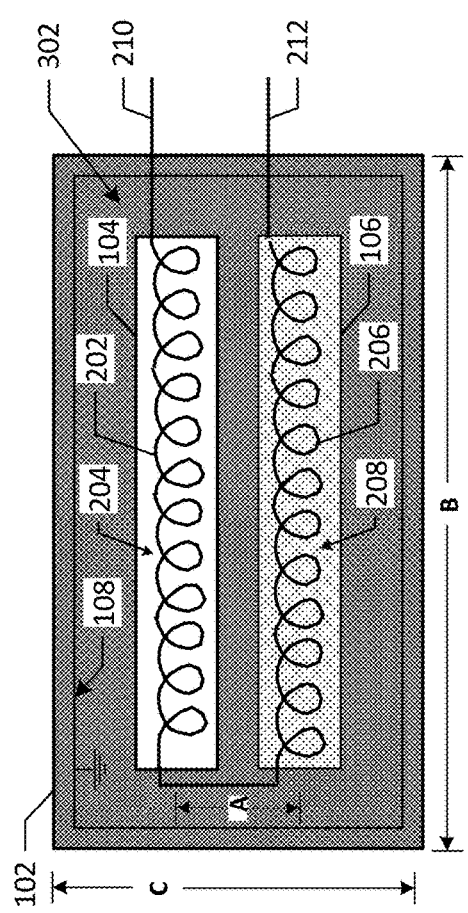
FIG. 3 provides yet another example neutral and/or ground harmonic filter system, according to one or more embodiments of the present disclosure.

FIG. 3 illustrates an example neutral and/or ground harmonic filter system 100", according to one or more embodiments of the present disclosure. The neutral and/or ground harmonic filter system 100" can be an alternate embodiment of the neutral and/or ground harmonic filter system 100 and/or the neutral and/or ground harmonic filter system 100'. The neutral and/or ground harmonic filter system 100" comprises the housing unit 102, the first coil unit 104, and the second coil unit 106. The housing unit 102 comprises the ground loop 108. In one or more embodiments, the first coil unit 104 comprises the conductive wire coil 202 and the insulating material 204. In addition, in one or more embodiments, the second coil unit 106 comprises the conductive wire coil 206 and the ferrous material 208.

In one or more embodiments, the neutral and/or ground harmonic filter system 100" further comprises a housing insulating material 302. For example, the housing insulating material 302 can be disposed in the housing unit 102. The housing insulating material 302 can comprise epoxy, silicone, sand, and/or any other type of insulating material. In certain embodiments, the housing insulating material 302 can comprise a combination of epoxy, silicone, sand, and/or another type of insulating material. In one or more embodiments, the housing insulating material 302 can comprise a combination of epoxy and sand. In some other embodiments, the housing insulating material 302 can comprise a combination of epoxy and acetone. The acetone can shorten the amount of time for the housing insulating material to harden, reducing the chances of leakage in the coils due to the extreme heat. The housing insulating material 302 can provide one or more advantages for the housing unit 102, the first coil unit 104, the second coil unit 106, and/or the ground loop 108. For example, the housing insulating material 302 can provide waterproofing for the first coil unit 104, the second coil unit 106, and/or the ground loop 108 to maintain proper conductivity in different environmental conditions for the housing unit 102.

B. EXAMPLE NEUTRAL AND/OR GROUND HARMONIC FILTER SYSTEM COUPLED TO ELECTRICAL SYSTEMS

Figure 4:
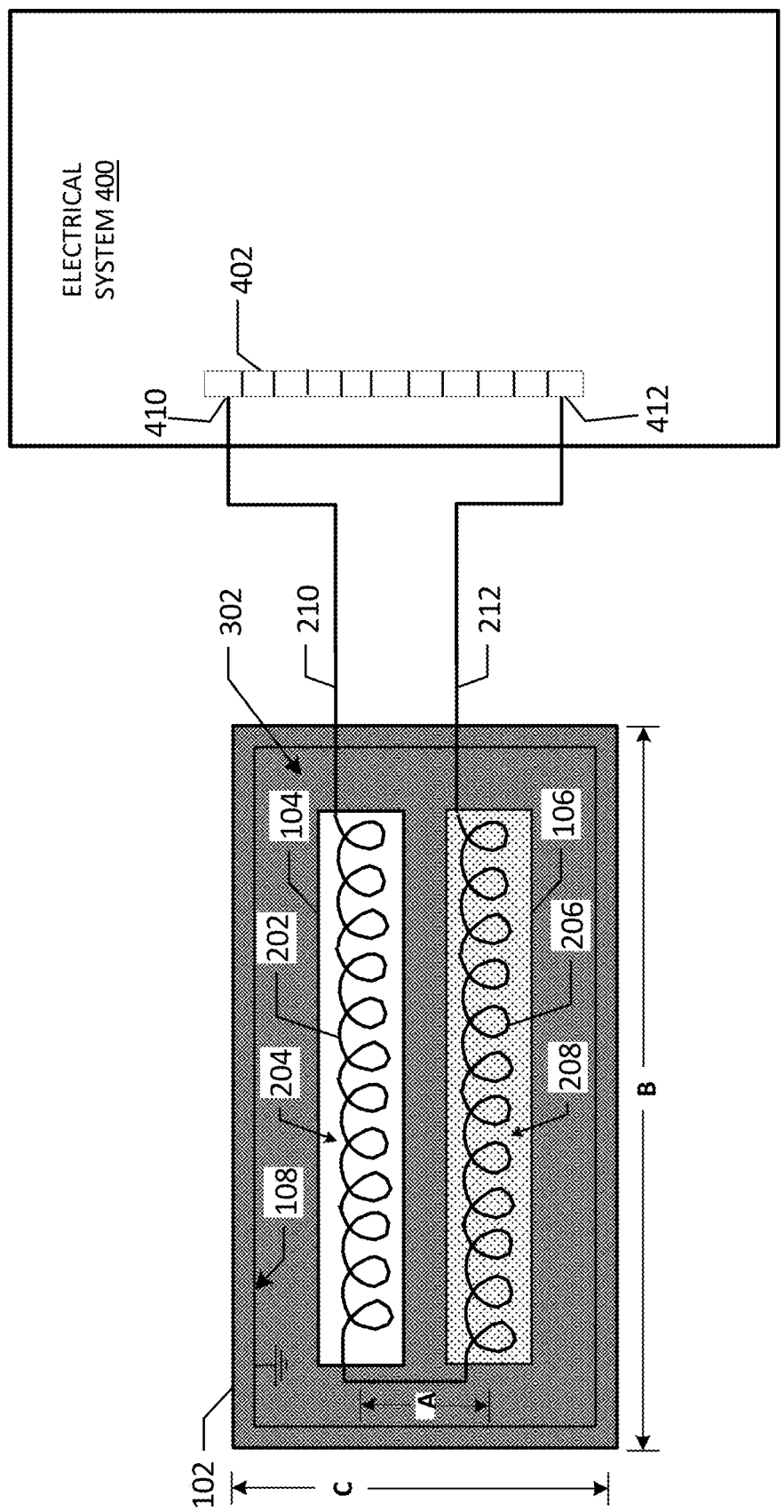
FIG. 4 provides an example neutral and/or ground harmonic filter system coupled to an example electrical system, according to one or more embodiments of the present disclosure.

FIG. 4 illustrates an example neutral and/or ground harmonic filter system coupled to an example electrical system 400, according to one or more embodiments of the present disclosure. In one or more embodiments, the contact 210 of the neutral and/or ground harmonic filter is electrically coupled to a first location 410 of a conductor bar 402. The contact 212 of the neutral and/or ground harmonic filter is electrically coupled to a second location 412 of the conductor bar 402. The conductor bar 402 can be a neutral conductor (or neutral bar), or a ground conductor (or ground bar) of the electrical system 400. The first location 410 and the second location 412 are spaced so that all neutral wires or ground wires are connected to the neutral conductor or the ground conductor between the first location and the second location. Note that other components of the electrical system and the connections between these components and the conductor bar 402 are not shown in FIG. 4.

In one or more embodiments, the electrical system 400 may be, include, or be associated with solar energy systems and controls, wind power systems, geothermal systems, uninterruptible power supplies, variable frequency drives, soft starts, vehicle or equipment charging systems, machinery systems, other power generation systems, controls and PLCs, and/or other devices, components, systems, and/or the like that either generate neutral and/or ground harmonics and electrical or mechanical systems containing a ground or neutral pathway.

In certain embodiments, the housing unit 102 is removably attached to the electrical system 400. For example, the housing unit 102 can be attached to the electrical system 400 (and capable of being removed from the electrical system 400) via a mechanical attachment (e.g., Velcro®), a chemical attachment, or another type of attachment.

In some embodiments, the housing unit 102 can be attached to the outside of the electrical system 400. In some other embodiments, the housing unit 102 can be attached to the inside of the electrical system 400.

Figure 5:
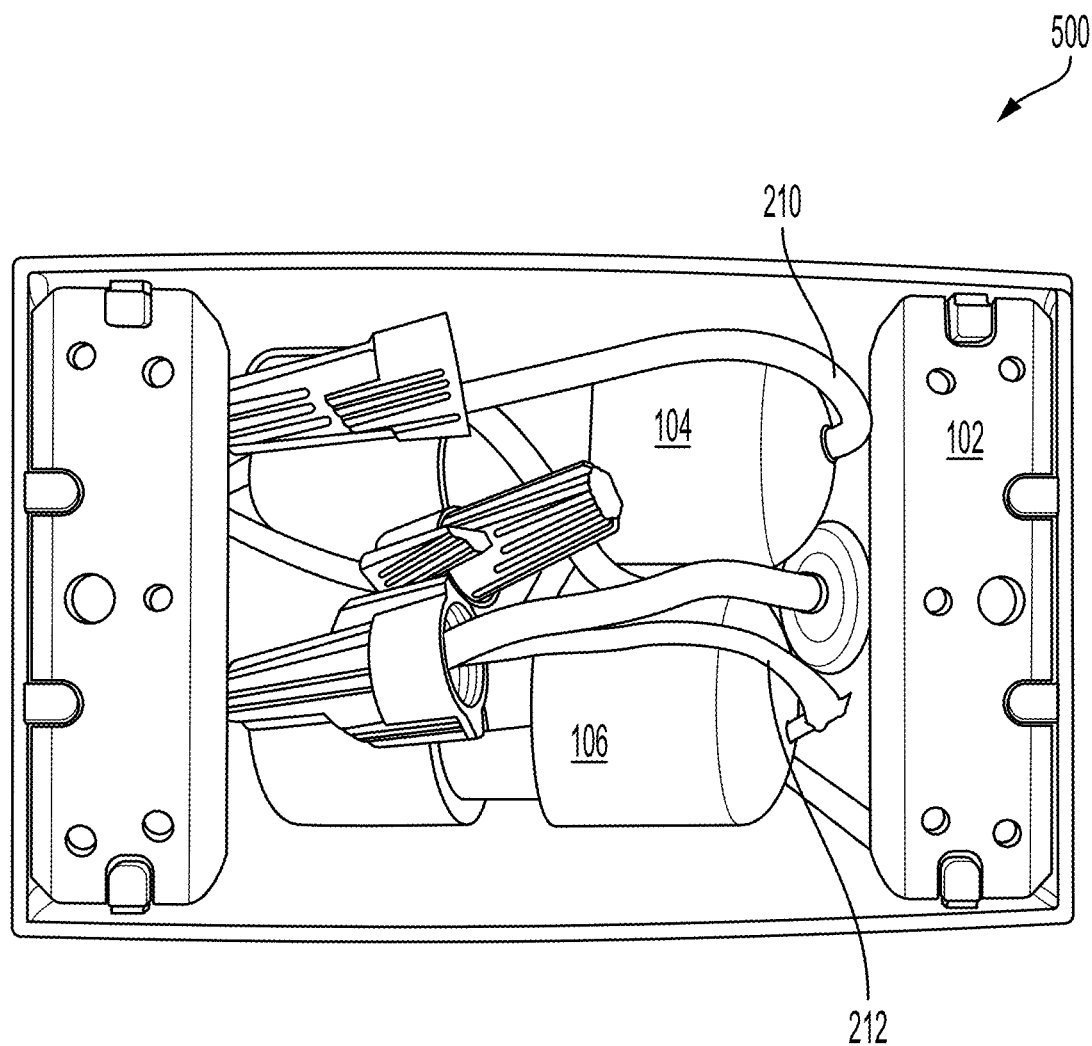
FIG. 5 provides a cutaway of an example neutral and/or ground harmonic filter system, according to one or more embodiments of the present disclosure.

FIG. 5 illustrates a cutaway of an example neutral and/or ground harmonic filter system 500, according to one or more embodiments of the present disclosure. The neutral and/or ground harmonic filter system 500 can be an alternate embodiment of the neutral and/or ground harmonic filter system 100, the neutral and/or ground harmonic filter system 100', and/or the neutral and/or ground harmonic filter system 100." The neutral and/or ground harmonic filter system 500 comprises the housing unit 102, the first coil unit 104, the second coil unit 106, and the contacts 210 and 212. In various embodiments, the neutral and/or ground harmonic filter system 500 can provide improved efficiency of electrical power usage for an electrical power system.

C. EXAMPLE CONDUCTIVE WIRE COIL

Figure 6:
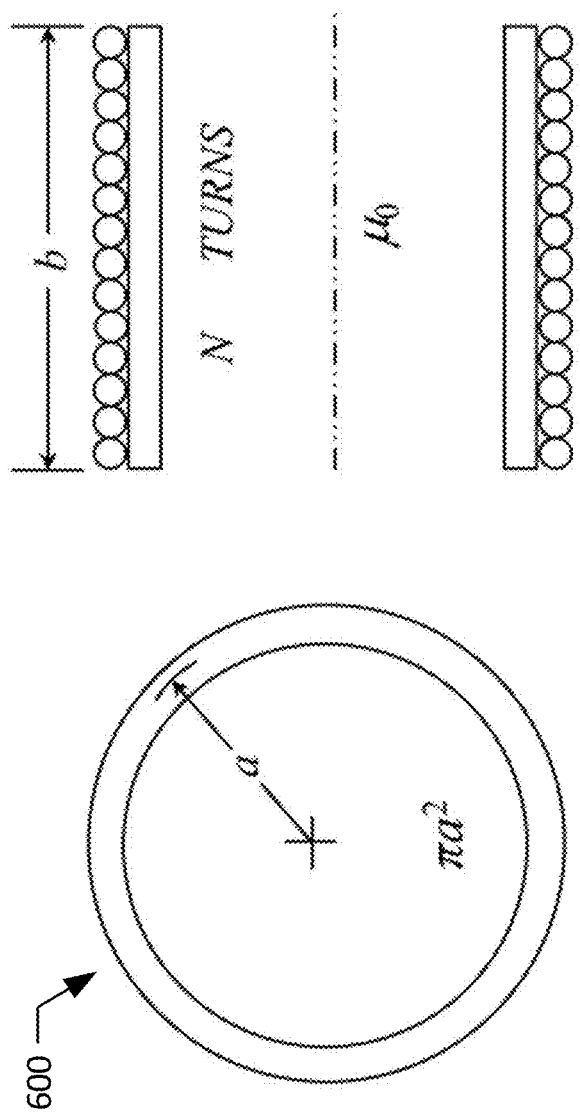
FIG. 6 provides an example conductive wire coil, according to one or more embodiments of the present disclosure.

FIG. 6 illustrates an example conductive wire coil 600, according to one or more embodiments of the present disclosure. For example, the conductive wire coil 600 can correspond to the conductive wire coil 202 of the first coil unit 104 and/or the conductive wire coil 206 of the second coil unit 106. An equation (1) can be utilized to calculate an inductance L of the conductive wire coil 600:

$$L = \mu_0 N^2 a \left( \ln(1 + \pi a/b) + \frac{1}{2.3 + 1.6\, b/a + 0.44(b/a)^2} \right) \quad (1)$$

where $\mu_0$ corresponds to permeability of the materials, including air, N corresponds to the number of coil turns, a corresponds to the radius of the conductive wire coil 600, and b corresponds to the length of the conductive wire coil 600.

When two or more coils are coupled together, the inductance of each individual coil is also affected by mutual inductance, in addition to the factors included in equation (1). Mutual inductance is generally calculated by equation (2).

$$L_{pq} = \frac{N_p k_{pq} \varnothing_{pq}}{i_q} \quad (2)$$

where $N_p$ is the number of turns in the pth coil, $k_{pq}$ is the coupling coefficient between the pth and qth coils and is defined as the fraction of the flux produced by the qth coil that links to the pth coil, and $\varnothing_{pq}$ is the magnetic flux passing through the pth coil due to the qth coil. For p≠q, $L_{pq}$ is called the mutual inductance between coils p and q; for p=q, $L_{pq}$ is the self-inductance of coil p. The resulting magnetic fields oppose changes in magnetic flux and the resulting current waveform.

In an example embodiment, the parameters associated with the conductive wire coil 202 of the first coil unit 104 and the conductive wire coil 206 of the second coil unit 106 are shown in Table A. The inductance of each coil is provided in Table A based on equation (1) (excluding mutual inductance).

TABLE A

Example Data

|  | conductive wire coil 206 | conductive wire coil 202 |
| --- | --- | --- |
| a (inches) | 0.212 | 0.25 |
| b (inches) | 1.89 | 2.2 |
| N | 12.5 | 12.5 |
| $\mu_0$ | $0.4\pi$ | $0.4\pi$ |
| L(uH) | 0.33953845 | 0.405157757 |

To filter out harmonics other than line frequency effectively, the desired filter impedance needs to be high at the associated harmonic frequencies. The circuit impedance can be represented as shown in equation (3).

$$Z = R + jn\omega L_{total} \quad (3)$$

where Z is impedance in Ohms, R is the DC resistance, j is the imaginary unit representing the phase shift between voltage and current, $L_{total}$ is the total inductance of multiple conductive wire coils in neutral and/or ground harmonic filter system 100, and $n\omega L_{total}$ is the inductive reactance ($2\pi n f\, L_{total}$) at the nth harmonics.

In a parallel circuit, the current is inversely proportional to the impedance. For harmonic currents, the high reactance of the inductor at high frequencies means most of the harmonic current will flow through the inductor, reducing the amount flowing through the rest of the circuit. The high frequency currents flow and dissipate their energy in the form of a magnetic field within the inductor. The total current flowing through the neutral and/or ground harmonic filter can be up to the total harmonic current within the selection of tuned harmonic currents.

D. CONCLUSION

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The modifications may include but are not limited to, materials, number of coils, number of turns, and location of coils in an enclosure. Although specific terms are employed herein, they are used in a generic and descriptive sense only and not for purposes of limitation.

E. EXAMPLES

The examples are provided for explanatory purposes.

Example 1. A neutral and/or ground harmonic filter system, comprising: a first coil unit comprising a first conductive wire coil, wherein (1) the first conductive wire coil comprises a first end and an opposite second end, (2) the first conductive wire coil is suspended in an insulating material, (3) the first conductive wire coil and the insulating material are disposed in a first non-conductive mechanical structure, and (4) the first end of the first conductive wire coil is electrically coupled to a first contact that extends from the first non-conductive mechanical structure; and a second coil unit comprising a second conductive wire coil, wherein (1) the second conductive wire coil comprises a first end and an opposite second end, (2) the second conductive wire coil is suspended in a ferrous material, wherein the ferrous material comprises metal particles and graphite particles, (3) the second conductive wire coil and the ferrous material are disposed in a second non-conductive mechanical structure, (4) the opposite second end of the second conductive wire coil is electrically coupled to a second contact that extends from the second non-conductive mechanical structure, and (5) the first end of the second conductive wire coil is electrically coupled to the opposite second end of the first conductive wire coil.

Example 2. The neutral and/or ground harmonic filter system of example 1 or any other example, wherein the first non-conductive mechanical structure comprises a first non-conductive tube, wherein the second non-conductive mechanical structure comprises a second non-conductive tube, and wherein a distance between a center of the first non-conductive tube and a center of the second non-conductive tube is less than 2.25 inches.

Example 3. The neutral and/or ground harmonic filter system of example 1 or any other example, wherein the first conductive wire coil and the second conductive wire coil each comprise 12 to 100 turns of conductive wire.

Example 4. The neutral and/or ground harmonic filter system of example 1 or any other example, wherein the ferrous material comprises a greater amount of the metal particles as compared to the graphite particles.

Example 5. The neutral and/or ground harmonic filter system of example 4 or any other example, wherein the ferrous material comprises approximately ⅔ metal particles and ⅓ graphite particles.

Example 6. The neutral and/or ground harmonic filter system of example 1 or any other example further comprising a housing unit in which the first coil unit and the second coil unit are both disposed.

Example 7. The neutral and/or ground harmonic filter system of example 6 or any other example, wherein the housing unit comprises a ground loop.

Example 8. The neutral and/or ground harmonic filter system of example 6 or any other example further comprising a housing insulating material disposed in the housing unit.

Example 9. The neutral and/or ground harmonic filter system of example 8 or any other example, wherein the housing insulating material comprises epoxy and acetone.

Example 10. The neutral and/or ground harmonic filter system of example 6 or any other example, wherein the first contact and the second contact further extend from the housing unit, providing electrical contacts to other electrical systems.

Example 11. An electrical system, comprising: a conductor bar; and a neutral and/or ground harmonic filter system comprising a first coil unit and a second coil unit and configured to mitigate neutral and/or ground harmonics of the electrical system, wherein: the first coil unit comprising a first conductive wire coil, wherein (1) the first conductive wire coil comprises a first end and an opposite second end, (2) the first conductive wire coil is suspended in an insulating material, (3) the first conductive wire coil and the insulating material are disposed in a first non-conductive mechanical structure, and (4) the first end of the first conductive wire coil is electrically coupled to a first contact that extends from the first non-conductive mechanical structure; the second coil unit comprising a second conductive wire coil, wherein (1) the second conductive wire coil comprises a first end and an opposite second end, (2) the second conductive wire coil is suspended in a ferrous material, wherein the ferrous material comprises metal particles and graphite particles, (3) the second conductive wire coil and the ferrous material are disposed in a second non-conductive mechanical structure, (4) the opposite second end of the second conductive wire coil is electrically coupled to a second contact that extends from the second non-conductive mechanical structure, and (5) the first end of the second conductive wire coil is electrically coupled to the opposite second end of the first conductive wire coil; and the first contact and the second contact are electrically coupled to a first location and a second location of the conductor bar respectively, wherein the first location and the second location are spaced apart so that a first set of conducting wires of the electrical system are electrically coupled to the conductor bar at locations between the first location and the second location.

Example 12. The electrical system of example 11 or any other example, wherein the conductor bar is a neutral bar and the first set of conducting wires comprise all neutral wires of the electrical system that are electrically coupled to the neutral bar.

Example 13. The electrical system of example 11 or any other example, wherein the conductor bar is a ground bar and the first set of conducting wires comprise all ground wires of the electrical system that are electrically coupled to the ground bar.

Example 14. The electrical system of example 11 or any other example, wherein the first non-conductive mechanical structure comprises a first non-conductive tube, wherein the second non-conductive mechanical structure comprises a second non-conductive tube, and wherein a distance between a center of the first non-conductive tube and a center of the second non-conductive tube is less than 2.25 inches.

Example 15. The electrical system of example 11 or any other example, wherein the first conductive wire coil and the second conductive wire coil each comprise 12 turns of conductive wire.

Example 16. The electrical system of example 11 or any other example, wherein the ferrous material comprises a greater amount of the metal particles as compared to the graphite particles.

Example 17. The electrical system of example 11 or any other example, wherein the neutral and/or ground harmonic filter system further comprises a housing unit in which the first coil unit and the second coil unit are both disposed.

Example 18. The electrical system of example 17 or any other example, wherein the housing unit comprises a ground loop.

Example 19. The electrical system of example 17 or any other example, wherein the neutral and/or ground harmonic filter system further comprises a housing insulating material disposed in the housing unit.

Example 20. The electrical system of example 19 or any other example, wherein the housing insulating material comprises epoxy and acetone.

The invention claimed is:

1. A neutral and/or ground harmonic filter system, comprising:

a first coil unit comprising a first conductive wire coil, wherein the first conductive wire coil comprises a first end and an opposite second end, the first conductive wire coil is suspended in an insulating material, the first conductive wire coil and the insulating material are disposed in a first non-conductive mechanical structure, and the first end of the first conductive wire coil is electrically coupled to a first contact that extends from the first non-conductive mechanical structure; and a second coil unit comprising a second conductive wire coil, wherein the second conductive wire coil comprises a first end and an opposite second end, the second conductive wire coil is suspended in a ferrous material, wherein the ferrous material comprises metal particles and graphite particles, the second conductive wire coil and the ferrous material are disposed in a second non-conductive mechanical structure, the opposite second end of the second conductive wire coil is electrically coupled to a second contact that extends from the second non-conductive mechanical structure, and the first end of the second conductive wire coil is electrically coupled to the opposite second end of the first conductive wire coil.

2. The neutral and/or ground harmonic filter system of claim 1, wherein the first non-conductive mechanical structure comprises a first non-conductive tube, wherein the second non-conductive mechanical structure comprises a second non-conductive tube, and wherein a distance between a center of the first non-conductive tube and a center of the second non-conductive tube is less than 2.25 inches.

3. The neutral and/or ground harmonic filter system of claim 1, wherein the first conductive wire coil and the second conductive wire coil each comprise 12 to 1,000 turns of conductive wire.

4. The neutral and/or ground harmonic filter system of claim 1, wherein the ferrous material comprises a greater amount of the metal particles as compared to the graphite particles.

5. The neutral and/or ground harmonic filter system of claim 4, wherein the ferrous material comprises approximately ⅔ metal particles and ⅓ graphite particles.

6. The neutral and/or ground harmonic filter system of claim 1 further comprising a housing unit in which the first coil unit and the second coil unit are both disposed.

7. The neutral and/or ground harmonic filter system of claim 6, wherein the housing unit comprises a ground loop.

8. The neutral and/or ground harmonic filter system of claim 6 further comprising a housing insulating material disposed in the housing unit.

9. The neutral and/or ground harmonic filter system of claim 8, wherein the housing insulating material comprises epoxy and acetone.

10. The neutral and/or ground harmonic filter system of claim 6, wherein the first contact and the second contact further extend from the housing unit, providing electrical contacts to other electrical systems.

11. An electrical system, comprising:

a conductor bar; and a neutral and/or ground harmonic filter system comprising a first coil unit and a second coil unit and configured to mitigate neutral and/or ground harmonics of the electrical system, wherein:

the first coil unit comprising a first conductive wire coil, wherein the first conductive wire coil comprises a first end and an opposite second end, the first conductive wire coil is suspended in an insulating material, the first conductive wire coil and the insulating material are disposed in a first non-conductive mechanical structure, and the first end of the first conductive wire coil is electrically coupled to a first contact that extends from the first non-conductive mechanical structure;

the second coil unit comprising a second conductive wire coil, wherein the second conductive wire coil comprises a first end and an opposite second end, the second conductive wire coil is suspended in a ferrous material, wherein the ferrous material comprises metal particles and graphite particles, the second conductive wire coil and the ferrous material are disposed in a second non-conductive mechanical structure, the opposite second end of the second conductive wire coil is electrically coupled to a second contact that extends from the second non-conductive mechanical structure, and the first end of the second conductive wire coil is electrically coupled to the opposite second end of the first conductive wire coil; and the first contact and the second contact are electrically coupled to a first location and a second location of the conductor bar respectively, wherein the first location and the second location are spaced apart so that a first set of conducting wires of the electrical system are electrically coupled to the conductor bar at locations between the first location and the second location.

12. The electrical system of claim 11, wherein the conductor bar is a neutral bar and the first set of conducting wires comprise all neutral wires of the electrical system that are electrically coupled to the neutral bar.

13. The electrical system of claim 11, wherein the conductor bar is a ground bar and the first set of conducting wires comprise all ground wires of the electrical system that are electrically coupled to the ground bar.

14. The electrical system of claim 11, wherein the first non-conductive mechanical structure comprises a first non-conductive tube, wherein the second non-conductive mechanical structure comprises a second non-conductive tube, and wherein a distance between a center of the first non-conductive tube and a center of the second non-conductive tube is less than 2.25 inches.

15. The electrical system of claim 11, wherein the first conductive wire coil and the second conductive wire coil each comprise 12 turns of conductive wire.

16. The electrical system of claim 11, wherein the ferrous material comprises a greater amount of the metal particles as compared to the graphite particles.

17. The electrical system of claim 11, wherein the neutral and/or ground harmonic filter system further comprises a housing unit in which the first coil unit and the second coil unit are both disposed.

18. The electrical system of claim 17, wherein the housing unit comprises a ground loop.

19. The electrical system of claim 17, wherein the neutral and/or ground harmonic filter system further comprises a housing insulating material disposed in the housing unit.

20. The electrical system of claim 19, wherein the housing insulating material comprises epoxy and acetone.

* * * * *

UNITED STATES PATENT AND TRADEMARK OFFICE
CERTIFICATE OF CORRECTION

| | | |
|---|---|---|
| PATENT NO. | : 12,260,980 B2 | Page 1 of 1 |
| APPLICATION NO. | : 18/659357 | |
| DATED | : March 25, 2025 | |
| INVENTOR(S) | : Josef Tomastik | |

It is certified that error appears in the above-identified patent and that said Letters Patent is hereby corrected as shown below:

In the Claims

At Column 15, Line 27, Claim 11, delete "system are" and insert -- system is --, therefor.

At Column 16, Line 1, Claim 12, delete "comprise" and insert -- comprises --, therefor.

At Column 16, Line 5, Claim 13, delete "comprise" and insert -- comprises --, therefor.

Signed and Sealed this
Eighth Day of July, 2025

Coke Morgan Stewart
*Acting Director of the United States Patent and Trademark Office*